United States Patent [19]

Schultz et al.

[11] 4,229,874

[45] Oct. 28, 1980

[54] METHOD OF MOUNTING A PIVOT INSERT

[75] Inventors: William J. Schultz, Lynnfield, Mass.; Carl F. Van Bennekom, Green Valley, Ariz.

[73] Assignee: General Electric Company, New York, N.Y.

[21] Appl. No.: 948,191

[22] Filed: Oct. 2, 1978

[51] Int. Cl.³ .............................................. B23P 11/00
[52] U.S. Cl. ...................................... 29/432; 308/2 R; 403/163; 403/283
[58] Field of Search .................... 29/432, 432.1, 432.2; 403/119, 163, 91, 283; 308/2 R

[56] References Cited

U.S. PATENT DOCUMENTS

| | | | |
|---|---|---|---|
| 2,300,785 | 11/1942 | Haydon | 29/432 X |
| 2,388,897 | 11/1945 | Ammon | 324/155 |
| 2,427,529 | 9/1947 | Hickok et al. | 308/2 R |
| 2,550,720 | 5/1951 | Richardson . | |
| 2,593,506 | 4/1952 | Wales | 29/432 X |
| 2,617,692 | 11/1952 | Bosch | 308/2 R |
| 2,886,783 | 5/1959 | Sicho . | |
| 2,996,673 | 8/1961 | Stimson et al. . | |
| 3,001,136 | 9/1961 | Rumpelein . | |
| 3,068,413 | 12/1962 | Sonatore . | |
| 3,460,234 | 8/1969 | Dantorno . | |
| 3,551,011 | 12/1970 | Alley | 403/163 X |
| 3,597,686 | 8/1971 | Kain et al. | 324/154 R |
| 3,639,836 | 2/1972 | Kisselmann | 324/154 R |
| 3,654,552 | 4/1972 | Sauser | 324/154 R |
| 3,729,804 | 5/1973 | Middleton | 324/154 R |
| 4,050,531 | 9/1977 | Ashbrook | 308/2 R |

*Primary Examiner*—Charlie T. Moon
*Attorney, Agent, or Firm*—P. E. Rochford; W. C. Bernkopf

[57] ABSTRACT

The present invention relates to an electrical measuring instrument of the D'Arsonval type and more specifically to an improved low cost and small suspension system for the bobbin or armature assembly of such an instrument. Such improved suspension system includes the combination of a small light weight bobbin having thin gauge, surface insulated conductor wound on a light weight bobbin frame. Thin conducting strips are mounted to the frame above and below and these thin plates are provided with pins extending above and below respectively into jeweled pin pockets. Each pin is inserted at its blunt end through a strip in which it later resides by incorporating the pin in a punch, mounting the strip over an opening in a die beneath the punch and aligning the blunt end of the pin with the opening in the die.

6 Claims, 11 Drawing Figures

METHOD OF MOUNTING A PIVOT INSERT

CROSS-REFERENCE TO RELATED APPLICATIONS

The subject application is related to the application of Edward F. Scannell entitled Adjustable Spring Regulator For Setting Indicating Instrument Pointer, filed Oct. 2, 1978 Ser. No. 948,174, and assigned to the same assignee as the subject application. This application also relates to the application of Edward F. Scannell and Donald E. Rogers, filed Oct. 2, 1978, Ser. No. 948,171, assigned to the same assignee as this application and entitled Means For Adjusting The Zero Point Setting Of An Instrument.

This application further relates to the application of Carl F. Van Bennekom, Donald E. Rogers and Edward F. Scannell, filed Oct. 2, 1978, Ser. No. 948,173, entitled Electrical Current Indicating Meter and assigned to the same assignee as this application.

Further this application relates to the application of William J. Schultz and Carl F. Van Bennekom, filed Oct. 2, 1978 Ser. No. 948,172 entitled Magnetic System For Electrical Current Indicating Meter, and assigned to the same assignee as this application.

Still further this application relates to the application of Edward F. Scannell and Edward D. Orth, filed Oct. 2, 1978 Ser. No. 948,197, entitled Shielded Electrical urrent Indicating Meter, and assigned to the same assignee as this application.

BACKGROUND OF THE INVENTION

It is well known that electrical instruments have very broad use in the electrical measuring art. Because of the large number of measurements which are made in regulating processes and apparatus operated electrically there is need for large numbers of instruments. Because of the large number there is a premium on the smaller size instruments so that the instruments can be grouped to give readily available information to persons using the instruments.

Further, because of the very large number of such instruments which are used and the many purposes and applications in which they are employed, it is desirable that they be made at low cost and yet with high reliability and accuracy in performance.

Instruments of the D'Arsonval type include a moving armature or coil assembly which is mounted for rotation through the field of a permanent magnet assembly. When the armature assembly is energized by means of a current flowing therethrough, the resulting magnetic fields interact to produce a torque which rotates the armature assembly relative to the permanent magnet assembly. An instrument pointer is generally connected to the movable armature assembly to yield a readout with respect to a faceplate or scale mounted behind the pointer as the torque is a function of the current magnitude.

One of the requirements for accuracy in electrical instruments of the D'Arsonval type as provided pursuant to the present invention is that they have small profile and yet be capable of producing reproducible readings from one meter to another. In part this is dependent on having a suspension mechanism for the armature assembly which is of desirably low profile and yet which can be produced with great reliability at low cost and in the desirable small size.

Of particular importance is the structuring of the armature assembly so that it will pivot with reliable low resistance to turning. In this respect the pivot mechanism, that is the means on which the armature assembly turns, must have both a low resistance to turning and also a high reproducibility in such low resistance from one meter to another.

Traditionally in the manufacture of moving coil instruments of the D'Arsonval type by prior art technique a pivot element in the form of a pin is used. The pin is assembled into a receiving opening in the center or axis of a cylindrical holder by means of a press fit. The holder with the pin pressed in place is attached in turn to a pointer support by staking the holder into a hole in the pointer support. This assembly is then mounted to the moving coil by bonding as by cement.

A second pivot and holder is pressed into an anchor which is, in turn, cemented to the opposite end of the moving coil. The parts are precisely located in a fixture, according to this prior art method, while the cement is being heat cured. This prior art process requires numerous precision fixtures so that a continuous process of loading the fixture, heat curing, cooling and unloading can be maintained.

While applicant has no specific knowledge of any specific prior art references to the use of punch and die assembly of pivot pins, it is thought that this general concept may have found application in the art of clock and watch making. However, the preparation of a pivot for an instrument and the pivot and instrument prepared are deemed novel and inventive by the applicant.

The general concept of crimping a pointer support assembly and insulator assembly to an armature is disclosed in U.S. Pat. No. 3,597,686 assigned to the same assignee as this application. However, as is evident from the 3,597,686 patent there is no teaching of combination of the crimped pointer support and insulator assemblies in pivot and jewel type instruments. Those distinctions will be made more evident in the description which follows.

OBJECTS OF THE INVENTION

Accordingly, one object of the present invention is to provide a low cost highly reliable electrical instrument having a low profile and having incorporated within the mechanism, means for suspending the bobbin and coil.

Another object is to provide a simple means and method by which a bobbin and coil of an electrical instrument may be reliably mounted at low cost.

A further object is to provide a suspension mechanism for an instrument which is simple to build and assemble and which makes possible the reliable pivoting of the coil and bobbin of the instrument.

Still another object of the invention is to provide a method of inserting pivot pins into thin strips of material to secure the pins therein.

A further object is to teach a means and method for pin insertion.

Still another object is to form an article comprising a pin mounted firmly and fixedly in a metal strip.

Another object is to provide a method by which a metal pin may be inserted in a metal strip with minimum preparation and with minimum insertion movement.

BRIEF STATEMENT OF THE INVENTION

Objects of this invention may be achieved by providing a pin having a long longitudinal dimension relative to its cross-sectional dimensions. The pin is held within a drive mechanism. A strip is placed on a work surface below the pin so that a pin end can enter the strip. A hole is provided in the work surface beneath the strip at the place where the pin is to enter the strip. The hole cross section conforms to those of the pin cross section. The drive mechanism is activated to drive the pin into the strip far enough to drive a portion of the strip into the hole and sever the portion from the strip.

In another of its aspects objects of this invention may be achieved by providing a bobbin for an electrical measuring instrument, providing two strips for mounting to said bobbin, inserting a pin in each strip by reverse insert motion, mounting the strip and pin combination to opposite portions of the bobbin to dispose the inserted pins in opposite directions relative to each other, securing the oppositely extending pin points in jeweled pin receptacles for pivot motion of the bobbin relative thereto.

In still another of its aspects the invention may be achieved by providing a pointed metal pin and a metal strip into which the pin is to be inserted, providing a punch for the pin to exert pressure on the pointed end of the pin on the beveled pin surface around the pin point, providing a die hole beneath the strip conforming to the cross-sectional contour of the blunt end of the pin, aligning the pin and strip in the punch, forcing the blunt end of the pin against the strip, and driving the pin a distance equal approximately to the thickness of the strip to cut metal from the strip having approximate cross section dimensions of and contour of the pin and die opening.

Pursuant to the present invention in another aspect a pivot element is provided. This pivot element includes a pin having a pointed end and a blunt end and a strip into which the pin is to be mounted. The pin is inserted at its blunt end through the thickness of the strip to remove from the strip a metal plug having a cross section matching that of the blunt end of the pin inserted into the strip.

DESCRIPTION OF THE PREFERRED EMBODIMENT

Figure 1:
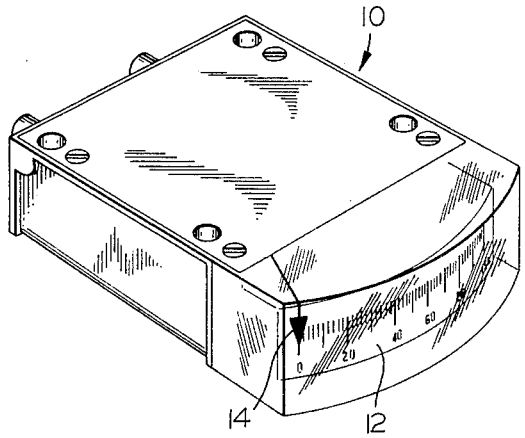
FIG. 1 is an exterior perspective view of an electric measuring instrument as may be provided pursuant to the present invention.

Referring first to FIG. 1, the instrument illustrated is one of a number of possible instruments in which the mechanism of the present invention can be employed. The particular instrument illustrated is an electrical instrument having a front scale 12 a pointer 14, which shows the values indicated by the instrument on the scale, and a generally rectangular housing 16 containing the sundry electrical elements and parts which make up the instrument. In the case of an electrical instrument the two electrical terminals 18 and 20 are the terminals to which wires carrying the current to be measured are connected.

Figure 2:
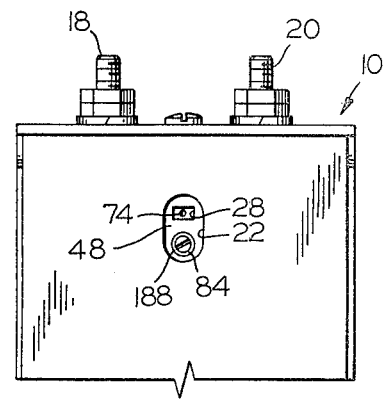
FIG. 2 is a partial bottom view of the instrument of FIG. 1.

In FIG. 2, an opening 22 in the back of casing 16 of instrument 10 makes visible a central hole 14 shown to include the jewel containing screw member 26 and also includes the control window 28. Within the control window 28 there is illustrated one perforation 30 of a series of perforations in the annular spring disc 32 only a portion of which is visible through the control window 28.

Figure 3:
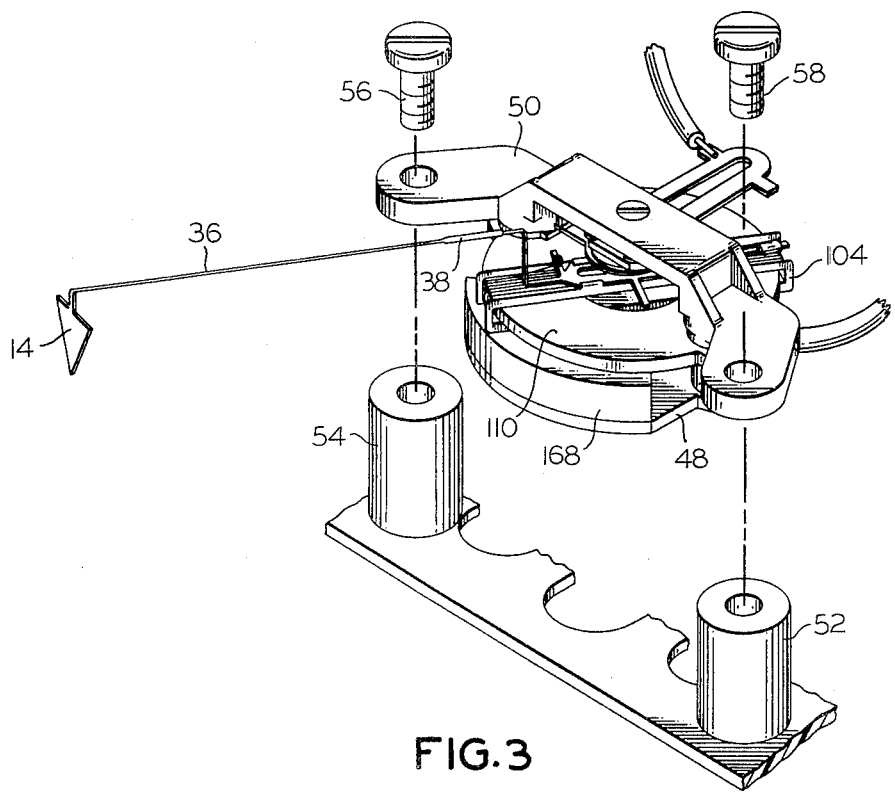
FIG. 3 is a partially exploded perspective view of the internal mechanism of the instrument as may be provided pursuant to the present invention.

Referring next to FIG. 3, one form of mounting of portions of an electrical measuring instrument is shown in a partially exploded perspective view. The pointer 14 corresponds to the pointer 14 in FIG. 1. The pointer arm 36 extends back from the pointer 14 to the pointer arm support 38. This support 38 is formed integrally with a plate 40 and the plate is mounted on the bobbin 42. The bobbin pivots about an upper flux plate 44. A magnetic element 46 is disposed above lower flux plate 48. The assembly is supported by the yoke 50 and is assembled to the posts 52 and 54 in the housing element 16. The screw members 56 and 58 hold the arms 60 and 62 of the yoke 50 in the respective positions in the posts 52 and 54.

Figure 4:
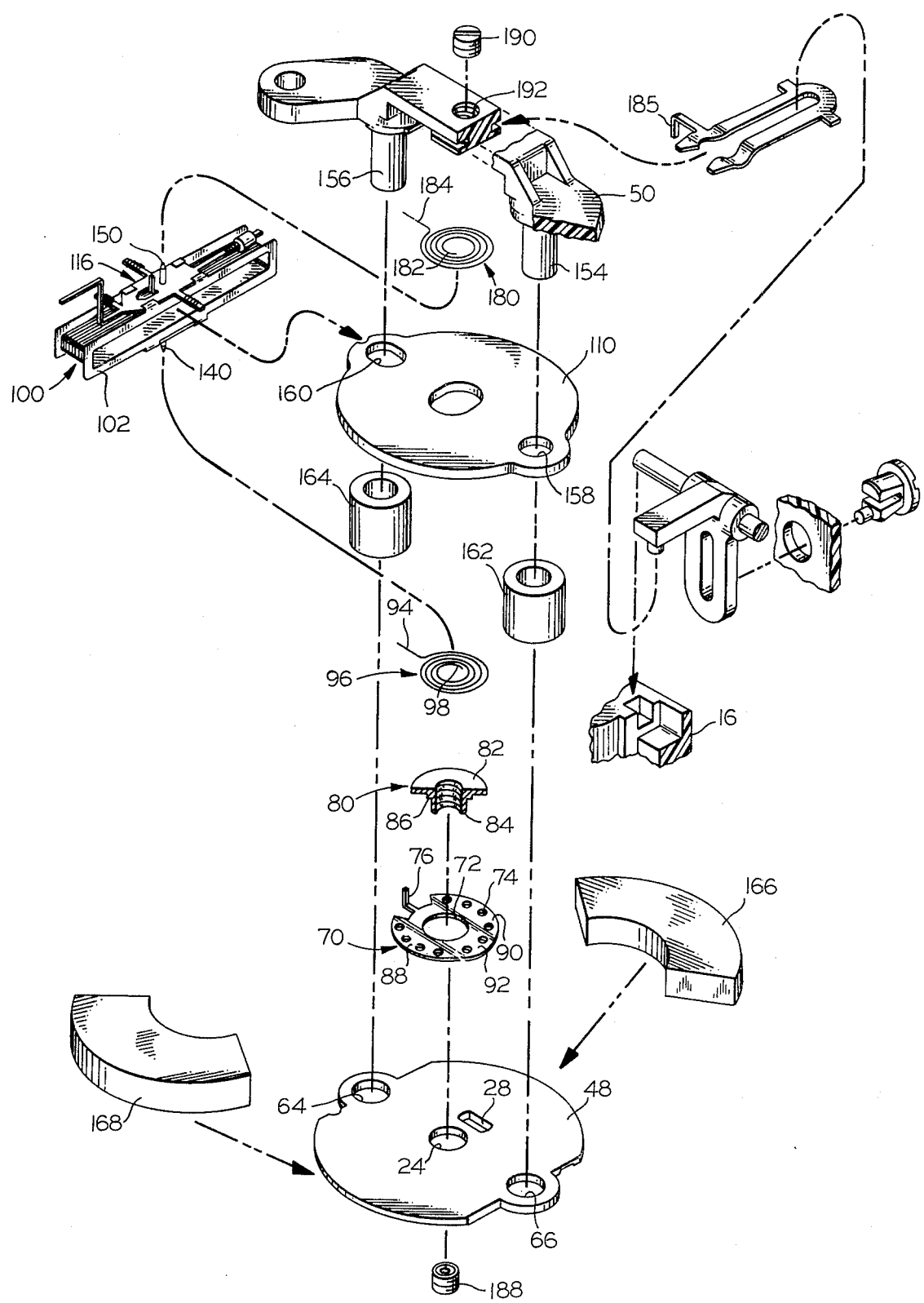
FIG. 4 is a more fully exploded view of the instrument components such as may be employed in a mechanism of the present invention.

Turning next to FIG. 4, the mechanism illustrated in part in FIG. 3 is shown in exploded view in FIG. 4. The portion of principal interest in relation to this invention is shown in the upper left portion of FIG. 4. Starting at the bottom of FIG. 4 there is a flux plate 48 having a center opening 24 and two side openings 64 and 66. A control window 28 provides access from beneath plate 48 to an annular leaf spring 70. The spring 70 is made up to include a center opening 72 as well as a number of peripheral openings 74. A side arm 76 for spring adjustment is formed integrally with the spring 70 and extends from one edge thereof to be attached as appropriate to a coil spring element 96 of the instrument or to an equivalent torsion means.

A flanged assembly eyelet 80 is disposed above the spring regulator disc 70 in the exploded view of the elements as illustrated in FIG. 4. The flanged assembly eyelet 80 includes the outwardly extending flange 82 and the downwardly extending collar 84. There is also a spacer shoulder 86 which is slightly smaller in diameter than the center opening 72 of the spring 70 and which is slightly less shallow than the full depth of the spring 70 with indentations made thereon. For example, in the spring of FIG. 4 the two side portions 88 and 90 are raised relative to a central portion 92. Side arm 76 of spring 70 is attached to side arm 94 of a lower coil spring 96. Such attachment may be by brazing, soldering, welding or the like. Coil spring 96 is attached at its center arm 98 to the under carriage of bobbin 100.

Figures 5, 6:
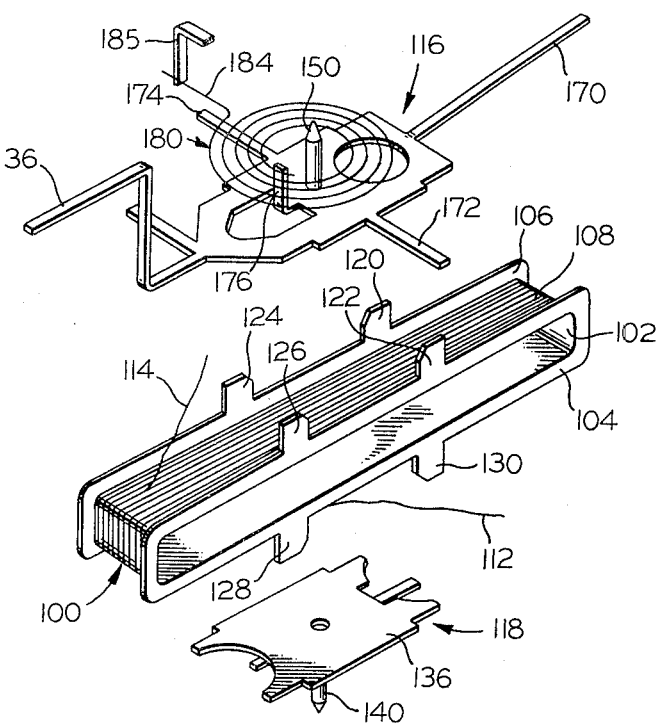
FIG. 5 is a detailed exploded view of the bobbin and related mechanism as may be provided pursuant to the present invention.
FIG. 6 is a vertical sectional view of the bobbin as assembled together with other elements of the instrument mechanism.

The details of the bobbin 100 are illustrated in FIG. 5.

Turning to FIG. 5 the bobbin 100 is really a hollow rectangular spool. The opening 102 of bobbin 100 is in the general form and dimension of the cross section of upper flux plate 110 as seen best in FIGS. 4 and 6. Flanges 104 and 106 extend from the outer edges of the bobbin to contain the winding 108 of insulated electric wire. The winding and bobbin form the armature of the D'Arsonval type instrument. The winding has two ends 112 and 114 which are attached to the upper strip 116 and lower strip 118 respectively.

The upper strip 116 is held in place on the top of the bobbin 100 by the upwardly extending tabs 120, 122, 124 and 126. These tabs are folded inward over respective parts of the strip 116 to hold the strip in place on the bobbin. The lower strip 118 is actually an insulating strip as illustrated in FIG. 5 and it is held to the bobbin by folding four tabs 128, 130, 132 and 134, only two of which are evident in FIG. 5, against the appropriate surfaces of the lower strip 118.

Figure 7:
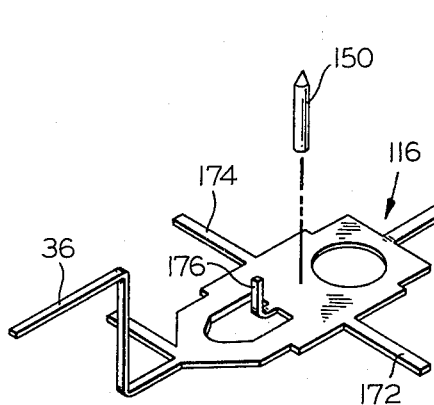
FIG. 7 is a perspective exploded view of a pin and bobbin contact strip prior to assembly of the pin to the strip.
Figure 8:
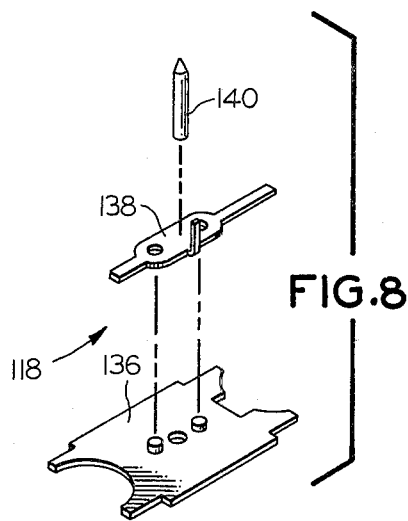
FIG. 8 is a perspective exploded view of a pin and second bobbin contact prior to assembly of the pin to the strip and prior to assembly of the pin bearing strip to an insulating separator to be mounted to the bobbin.

As is evident from FIG. 8 the lower strip 118 is made up of an insulating strip 136, the conducting strip 138, and the pin 140. As will be explained more fully below the pin 140 is driven into and through strip 138 to mount the pin in the strip. Similarly with reference to FIG. 7, the pin 150 is driven into strip 116 to mount the pin in the strip.

Turning again to FIG. 4, the bobbin 100 is assembled over the flux plate 110 and the flux plate is assembled to the flux plate 48 using the yoke 50 to hold the parts together. Yoke 50 has two depending legs 154 and 156. These legs pass through the openings 158 and 160 in upper flux plate 110; through the two spacer bushings 162 and 164 and through the openings 66 and 64 of lower flux plate 48. Magnet elements 166 and 168 are also assembled into their respective positions on lower flux plate 48 and when so assembled provide the flux and corresponding magnetic field through which the bobbin, and the winding wound on the bobbin, turn as the instrument is utilized. The elements to the right of FIG. 4 are not part of the present invention and are not described here. However, they are described in the co-pending application filed simultaneously herewith and assigned to the same assignee as the subject application.

Turning again to the FIG. 5 the pointer arm 36 extends from one end of strip 116 and the oppositely extending arm 170 as well as the side arms 172 and 174 are employed for holding weights in the form of wire coils by which the balance of the armature including the bobbin and coil is achieved. The upwardly extending arm 176 is the contact arm for strip 116 and this is the arm which is connected to the upper coil spring 180. The attachment of the upper coil spring 180 to the contact arm 176 of strip 116 is to the inner end 182 of the coil spring 180. The outer end 184 of coil spring 180 is attached to a contact 185 from which current is supplied through the coil spring 180, through the contact arm 176, and through strip 116 to the coil wound on bobbin 100.

Figure 11:
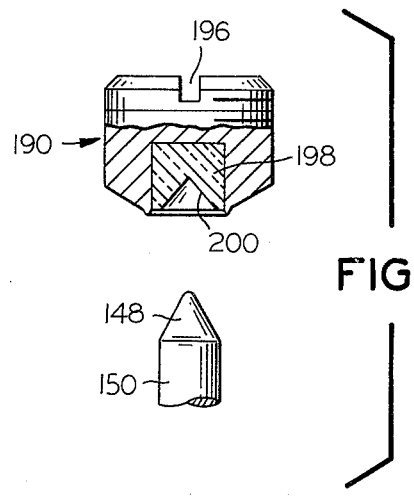
FIG. 11 is a side elevational view, in part in section of a jewel poised over the pointed end of a pin.

Referring again to FIG. 4 the two jeweled screw elements 188 and 190 are illustrated at the uppermost and lowermost portions of FIG. 4. These jeweled screw members are threaded respectively into the threaded interior of an opening 192 in yoke 50 and the threaded interior 186 of the eyelet 80. The screw member 190 is illustrated in part in section in FIG. 11 where the member is seen to be made up of a slotted head having slot 196 and having the jewel 198 with a pivot recess 200 in the underside thereof. The pin 150 is illustrated in FIG. 11 disposed in position for entry at the pointed tip 148 into the recess 200 of pin 150.

Figure 9:
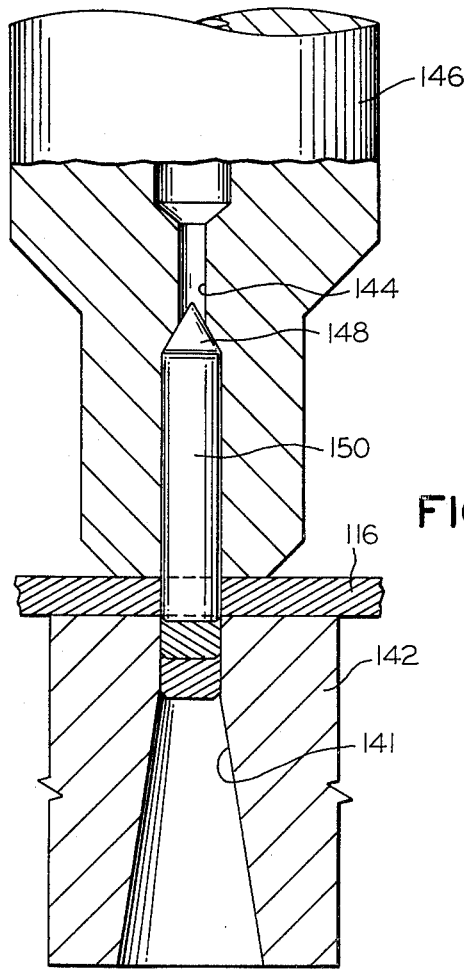
FIG. 9 is a vertical sectional view illustrating a pin in place in a punch and a strip disposed over a conforming hole in the base below the punch.
Figure 10:
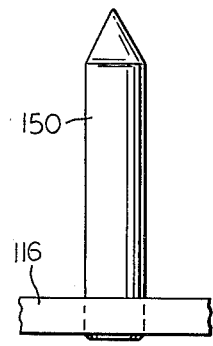
FIG. 10 is a side elevational view of a pin inserted in a strip.

The actual mounting of a pin such as 150 into a strip such as 116 may be accomplished as illustrated in FIG. 9. In this figure the pin 150 is seen to be inserted with its point 148 at the upper end thereof into a punch 146. A recess 144 in punch 146 protects the point of tip 148 from damage. A die platform 142 having opening 141 therein is positioned under punch 146 to receive the pin 150 as it is driven down and through the strip 116. An assembly of the pin 150 in the strip 116 is illustrated in FIG. 10 and shows the results obtained by the pin insertion technique illustrated in FIG. 9. The insertion technique is employed in inserting pin 150 in strip 116 and also in inserting pin 140 into strip 138.

After the pins 150 and 140 have been assembled to the strips and the strips are in turn assembled to the bobbin then the completion of the assembly is accomplished by mounting the bobbin 104 over the upper flux plate 110 and disposing the two pins 140 and 150 respectively into the lower and upper jeweled screw elements 188 and 190 respectively. The threading of the jeweled screw elements permits the jewel to be tightened to make both physical contact with both pins and then by reverse threading motion of one of the screw elements it can be moved into a position where the pins move easily but within very close tolerance limits within the jeweled screw elements 188 and 190.

Turning again to the illustration of the pin insertion mechanism as presented in FIG. 9, the punch 146 is designed and built specifically to hold the particular pin which is to be employed in the punch operation involved in insertion of the pin in a strip or plate such as 116. In effect the pin, despite its very small diameter, becomes a part of the punch and is used as part of the punch. It is evident from the relationship of FIG. 9 that this small diameter pin can penetrate a strip having a thickness which is of the order of two-thirds of the diameter of the pin itself. In an actual example a pin having a diameter of 0.0508 cm. (0.020 inches) plus 0.0000 and minus 0.000762 cm. (0.0003 inches) was punched into a brass strip having a thickness of 0.034544 cm. (0.0136 inches).

The strip may be surface tinned as by dipping or electroplating to facilitate soldering of an electrical conductor such as an inner end of a coil spring thereto.

The pin itself may be a hard steel having a polished surface. The tip of the point is preferably given a radius of about one mil to serve well in its pivot function in the instrument.

The pin is held firmly and fixedly in the strip and does not move from its fixed position in the strip during handling and operation of the instrument. This is deemed to be in part at least due to hoop stresses developed in the strip.

The actual penetration of the strip is a somewhat delayed and sudden process in that the blunt end of the pin first rests on and exerts force on the upper surface of the strip. Then after the force is built up to a considerable degree the blunt end suddenly plunges rapidly through the strip and in doing so expels a plug of metal, two of which are seen beneath the pin in the opening of the die.

It will be noted that even though the blunt end of the pin has slightly rounded edges, there is a cutting edge on the die similar to conventional punch and die structures.

The reason why the pin insertion method of this invention works so well and results in an article which is so firmly and fixedly held together is not fully understood. However, it is very clear from the method and article that the results are highly successful and dependable while being achieved at low cost and with low labor input.

We claim:

1. The method of forming a pivot element comprising:
    providing a pin to serve as a pivot pin having a blunt end and a pointed end;
    providing a strip to receive and hold the pin;
    providing a punch to contain said pin, where a portion of said punch immediately above the point of said pin is recessed, and with a portion of the blunt end extending from said punch to a distance slightly greater than the thickness of said receiving strip;
    placing said strip on a die having an opening of approximately the same cross section as that of the blunt end of the pin;
    aligning the blunt end of the pin above the die hole and above the strip disposed on the die;
    driving the punch to force the blunt end through the strip to remove a slug of metal from said strip as the pin acts on the strip.

2. The method of claim 1 wherein the pin is of a circular cross section and the die hole is of a circular cross section.

3. The method of claim 1 wherein the pressure on the punch is raised until the pin abruptly penetrates the strip.

4. The method of claim 1 wherein the blunt end of said pin has radiused corners.

5. The method of claim 1 wherein the pin and strip are of metal.

6. The method of claim 2 wherein the diameter of the pin is approximately 50% greater than the thickness of the strip.

* * * * *